United States Patent
Roscheisen et al.

(10) Patent No.: US 7,227,066 B1
(45) Date of Patent: Jun. 5, 2007

(54) POLYCRYSTALLINE OPTOELECTRONIC DEVICES BASED ON TEMPLATING TECHNIQUE

(75) Inventors: Martin R. Roscheisen, San Francisco, CA (US); Brian M. Sager, Palo Alto, CA (US)

(73) Assignee: Nanosolar, Inc., Palo Alto, CA (US)

( * ) Notice: Subject to any disclaimer, the term of this patent is extended or adjusted under 35 U.S.C. 154(b) by 443 days.

(21) Appl. No.: 10/829,928

(22) Filed: Apr. 21, 2004

(51) Int. Cl.
- C30B 23/00 (2006.01)
- H01L 31/00 (2006.01)
- H01L 29/08 (2006.01)
- H01L 21/00 (2006.01)

(52) U.S. Cl. .................. 977/948; 136/252; 136/263; 136/256; 136/255; 977/742; 117/94; 257/40; 257/465; 257/466; 257/464; 257/461; 438/82; 438/71; 438/88; 438/57

(58) Field of Classification Search .............. 136/252, 136/263, 256, 255; 257/40, 465, 466, 464, 257/461; 438/82, 71, 88, 57
See application file for complete search history.

(56) References Cited

U.S. PATENT DOCUMENTS

| | | | |
|---|---|---|---|
| 6,221,154 B1 * | 4/2001 | Lee et al. ............. 117/87 |
| 6,228,243 B1 * | 5/2001 | Menezes ............... 205/170 |
| 6,716,409 B2 * | 4/2004 | Hafner et al. ......... 423/447.1 |
| 6,743,408 B2 * | 6/2004 | Lieber et al. ......... 423/447.1 |
| 6,762,331 B2 * | 7/2004 | Hong et al. ........... 568/732 |
| 6,852,920 B2 * | 2/2005 | Sager et al. .......... 136/263 |
| 6,887,453 B2 * | 5/2005 | Brorson et al. ........ 423/561.1 |
| 6,946,597 B2 * | 9/2005 | Sager et al. .......... 136/263 |
| 6,987,071 B1 * | 1/2006 | Bollman et al. ....... 438/780 |
| 7,005,391 B2 * | 2/2006 | Min et al. ............. 438/778 |
| 2002/0185368 A1 * | 12/2002 | Hong et al. ........... 204/157.4 |
| 2003/0175844 A1 * | 9/2003 | Nadler et al. ......... 435/23 |
| 2003/0178580 A1 * | 9/2003 | Harnack et al. ....... 250/492.2 |
| 2004/0084080 A1 * | 5/2004 | Sager et al. .......... 136/263 |
| 2004/0175844 A1 * | 9/2004 | Yang et al. ........... 438/2 |
| 2004/0202599 A1 * | 10/2004 | Xu et al. .............. 423/345 |
| 2004/0250848 A1 * | 12/2004 | Sager et al. .......... 136/252 |
| 2005/0036937 A1 * | 2/2005 | Brorson et al. ........ 423/561.1 |
| 2005/0036939 A1 * | 2/2005 | Wong et al. ........... 423/598 |
| 2005/0095422 A1 * | 5/2005 | Sager et al. .......... 428/336 |

(Continued)

OTHER PUBLICATIONS

U.S. Appl. No. 10/290,119 entitled "Optoelectronic Device and Fabrication Methods", filed Nov. 5, 2002.

U.S. Appl. No. 10/303,665 entitled "Molding Technique for Fabrication of Optoelectronic Devices", filed Nov. 22, 2002.

(Continued)

Primary Examiner—Yogendra Gupta
Assistant Examiner—G. Nagesh Rao
(74) Attorney, Agent, or Firm—Joshua D. Isenberg; JDI Patent (57) ABSTRACT

Methods for passivating crystalline grains in an active layer for an optoelectronic device and optoelectronic devices having active layers with passivated crystalline grains are disclosed. Crystalline grains of an active layer material and/or window layer material are formed within the nanotubes of an insulating nanotube template. The dimensions of the nanotubes correspond to the dimensions of a crystalline grain formed by the deposition technique used to form the grains. A majority of the surface area of these grains is in contact with the wall of the nanotube template rather than with other grains.

24 Claims, 3 Drawing Sheets

U.S. PATENT DOCUMENTS

| | | | |
|---|---|---|---|
| 2005/0098205 A1* | 5/2005 | Roscheisen et al. | 136/263 |
| 2005/0100736 A1* | 5/2005 | Hyldgaard et al. | 428/408 |
| 2005/0121068 A1* | 6/2005 | Sager et al. | 136/252 |
| 2005/0183767 A1* | 8/2005 | Yu et al. | 136/263 |
| 2005/0183768 A1* | 8/2005 | Roscheisen et al. | 136/263 |
| 2005/0202684 A1* | 9/2005 | Min et al. | 438/778 |
| 2005/0229744 A1* | 10/2005 | Kijima | 75/255 |
| 2006/0169975 A1* | 8/2006 | Noy et al. | 257/40 |
| 2006/0174934 A1* | 8/2006 | Sager et al. | 136/256 |
| 2006/0219288 A1* | 10/2006 | Tuttle | 136/243 |

OTHER PUBLICATIONS

U.S. Appl. No. 10/319,406 entitled "Nano-Architected/Assembled Solar Electricity Cell", filed Dec. 6, 2002.

U.S. Appl. No. 10/719,042 entitled "Photovoltaic Device Fabricated by Anisotropic Etch Using Andoized Nanotube Template Etch Mask", filed Nov. 21, 2003.

U.S. Appl. No. 10/781,081 entitled "3D Structured Photovoltaic Cells", filed Feb. 17, 2004.

U.S. Appl. No. 10/782,017 entitled "Solution-Based Fabrication of Photovoltaic Cell", filed Feb. 19, 2004.

\* cited by examiner

POLYCRYSTALLINE OPTOELECTRONIC DEVICES BASED ON TEMPLATING TECHNIQUE

FIELD OF THE INVENTION

Embodiments of the present invention are directed to optoelectronic devices and more particularly to optoelectronic devices wherein the active layer includes crystalline grains within an insulating nanotube template.

BACKGROUND OF THE INVENTION

Optoelectronic devices such as photovoltaic devices are often made in the form of one or more cells. Each cell typically includes an active layer (sometimes including a window layer) between two electrodes, at least one of which is usually transparent. The active layer of the cells absorbs light to produce a current and voltage. Thin-film inorganic cells for optoelectronic devices are often contain polycrystalline inorganic materials in the active layer. Polycrystalline materials have distinct grains of crystal structures separated by grain boundaries. Unfortunately devices made from such cells can suffer from losses in efficiency, stability, and reproducibility due to effects at the grain boundaries arising from the polycrystallinity of the active layer of the cell.

The active layer of inorganic cells can be comprised of a range of light-absorbing and charge-transmitting materials. For example, an active layer can be created by forming an alloy of copper, indium, gallium, and selenide or sulfur (CIGS). Alternatively, an active layer can be created by synthesizing C admium Telluride (CdTe) or C admium Selenide (CdSe). Copper Sulfide can also be used an inorganic absorber material in the active layer. Additional inorganic active layers include blends, alloys, and mixtures of metals from groups IB, IIIA and VIA in the periodic table of elements. For each of these inorganic materials, the absorber layer typically forms in crystalline domains.

Figure 1:
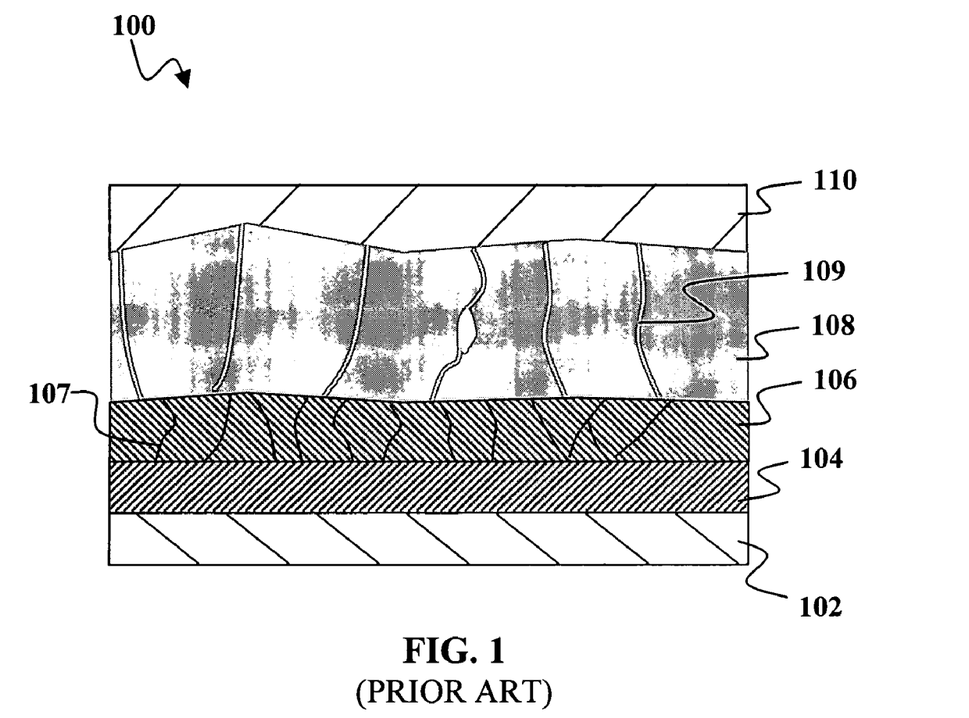
FIG. 1 is a schematic diagram of a solar cell according to the prior art.

While the ideal target of an inorganic solar cell (CIGS, CdTe, etc.) may be one that is (or closely approximates) a single-crystalline cell, it is generally most economical and commercially viable to apply techniques and processes that produce cells with a poly-crystalline active absorber layer. FIG. 1 illustrates a solar cell device 100 according to the prior art. The device 100 can be built up from a substrate 102 and includes bottom electrode 104, a window layer 106, e.g., cadmium sulfide (CdS), an active layer 108 e.g., Copper Indium Gallium Selenium (CIGS), and a top electrode 110. The window layer 106 and active layer 108 often tend to form distinct grains separated by grain boundaries 107, 109 respectively. The grain boundaries 107, 109 inhibit carrier transport, provide sites for carrier non-productive recombination, and facilitate unwanted diffusion of materials (e.g. the diffusion of S from CdS in inorganic solar cells—a known cause of poor long-term stability). The grain boundaries 107, 109 also tend to be irregular and varied in size, which can give rise to issues of variability and/or reproducibility arising from the uniform/non-uniform application of inorganic materials, and correspondingly varied active layer performance in different areas of the cell. All of these effects tend to degrade to performance of the solar cell 100.

Further, certain active layer materials such as grains comprised of combinations of copper with indium and/or gallium and selenium or sulfur tend to have poor adhesion to common substrate materials. In the prior art, the substrate 102 has been coated with about 500 nm of (relatively expensive) molybdenum (which may double as the electrode 104) to promote adhesion between the CIGS layer and that underlying substrate 102.

Thus, there is a need in the art, for an optoelectronic cell architecture that addresses the detrimental effects of grain boundaries and a corresponding method for making such a cell.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

GLOSSARY

The following terms are intended to have the following general meanings as they are used herein:

The indefinite article "A", or "An" refers to a quantity of one or more of the item following the article, except where expressly stated otherwise, e.g., "a single" layer.

Active Layer generally refers to the layer or layers within an optoelectronic device where conversion of radiant energy to electrical energy takes place (or vice versa).

Anodization refers to the formation of a film, such as an oxide, on a conducting material, such as a metal, by electrolysis.

Aspect Ratio: refers to the ratio of nanotube height or depth to nanotube width.

Band Gap: refers to the energy difference between the HOMO and LUMO levels (or between the conduction valence bands) in a charge transfer material or semiconductor.

Complementary charge-transfer properties: As used herein, a first and second semiconductor materials are said to have complementary charge-transfer properties with respect to each other when the first material is a hole-acceptor and/or hole-transporter with respect to the second and the second is an electron-acceptor and/or electron-transporter with respect to the first or vice versa. Two materials can have complementary charge-transfer properties if they have different electron affinities.

Efficiency: For a photovoltaic device or active layer, the efficiency is the ratio of energy output (e.g., in the form of electrons) to the necessary energy input (e.g., in the form of photons).

Includes, including, e.g., "such as", "for example", etc., "and the like" may, can, could and other similar qualifiers used in conjunction with an item or list of items in a particular category means that the category contains the item or items listed but is not limited to those items.

Inorganic Materials: Materials that do not contain carbon as a principal element. Examples include metals, metal-oxides, metal selenides, metal tellurides, alloys of metals selected from groups IB, IIIA and VIA of the periodic table of elements, and mixtures, blends, and alloys of the above, whether doped or undoped.

Nanostructured: generally refers to the property of having ordered features with a characteristic dimension on the order of several nanometers ($10^{-9}$ m) up to ten's of nm across.

Organic Materials: Compounds, which principally consist of carbon and hydrogen, with or without oxygen, nitrogen or other elements, except those in which carbon does not play a critical role (e.g., carbonate salts).

Photovoltaic Device: A device that absorbs radiation and coverts energy from the radiation into electrical energy. Solar cells are examples of photovoltaic devices.

Radiation: Energy which may be selectively applied including electromagnetic energy having a wavelength between about $10^{-14}$ and about $10^4$ meters including, for example, gamma radiation, x-ray radiation, ultraviolet radiation, visible light, infrared radiation, microwave radiation and radio waves.

Semiconductor: As used herein, semiconductor generally refers to a material characterized by an electronic band gap typically between about 0.5 eV and about 3.5 eV.

Solar Cell: A photovoltaic device that interacts with radiation (often in the form of sunlight) impinging on the device to produce electric power/voltage/current.

Embodiments of the present invention deposit inorganic absorber materials within ordered nanotube template substrates having an array or matrix of substantially uniform and numerous nanotubes. If the nanotubes in the template are sufficiently small, each will on average typically contain either a single-crystalline grain or a small number of crystalline grains of active layer material, with the majority of the surface area of these grains in contact with the wall of the template rather than with other grains. In this manner the grains will form more heterojunctions than homojunctions, which, depending upon the choice of template wall material, can be used to tune the performance features of the cells.

Preferably, the template is made of an electrically insulating material, such as aluminum oxide or silica. Typically the average width of the nanotubes should be designed to be smaller than the expected average width of the grains. For example, since the average length of a CIGS grain in the thin film of a photovoltaic cell ranges from 100 nm to 5 microns, the depth of a nanotube should be tuned within the length range. Similarly, both the width and the average aspect ration of the nanotube should be adjusted to about the average width and aspect ration of a single crystal grain. So that a majority of nanotubes contain about one crystalline grain, the average nanotube should preferably be smaller than the typical grain size.

The result is a cell that is poly-crystalline and where each grain is of substantially uniform size due to the shape-forming nature of the nanotemplate. Thus, embodiments of the present invention, address the detrimental effects of grain boundaries by growing crystalline grains of an inorganic active layer in a three-dimensionally ordered template of nanotubes with substantially similar depth, width, and aspect ratio.

Typically, the crystalline grains will be of different sizes. It is important to determine an expected size distribution for the crystalline grains in order to appropriately choose the size of the nanotubes in the ordered nanotube template. An average grain size distribution can be determined by scanning electron microscopy (SEM) or transmission electronic (TEM) analyses of cross sections of thin films of inorganic fabricated using the same or similar deposition and processing conditions as those to be used for the active components of solar cells. Typically an initial grain size distribution is determined from inorganic materials deposited and processed on relatively "flat", non-structured surfaces. Image analyses, e.g., by scanning electron microscopy (SEM), scanning tunneling microscopy (STM) or atomic force microscopy (AFM), can then be used to measure quantitatively measure the length, width, and aspect ratio of the grains in the sample components. Based on these measurements, the dimensions of the nanotubes can be optimized to promote the growth of single crystals or small numbers of crystals within each of the nanotubes in the templates: Once the expected grain size distribution is known, the sizes of the nanotubes in the ordered template can be adjusted to be small enough so that the majority of the nanotubes are smaller than a chosen size at or near the lower end of the grain size distribution. Note that as a practical matter it is not necessary, and perhaps not possible, to ensure that every nanotube is smaller than every expected grain. It is sufficient that the nanotubes be smaller than a majority of the expected grain sizes.

Figure 2A:
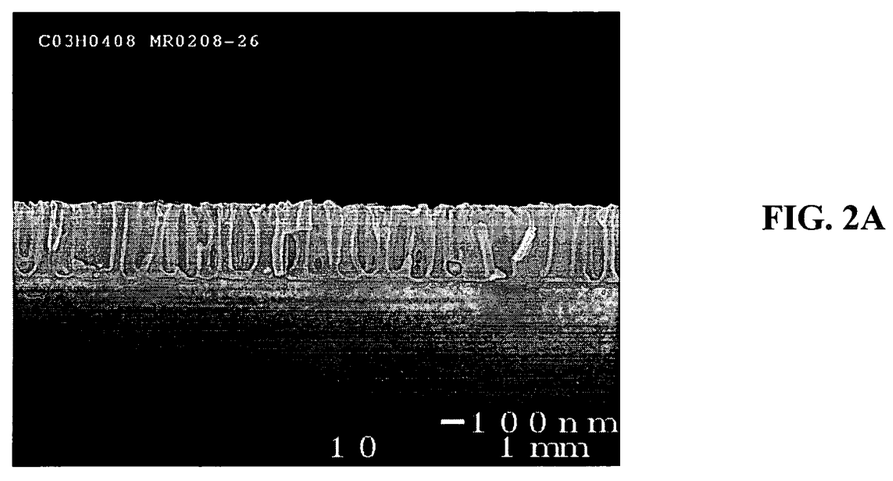
FIG. 2A depicts scanning electron microscope (SEM) image of a vertical cross-section of an ordered nanotube template of a type that may be used with embodiments of the present invention.
Figure 2B:
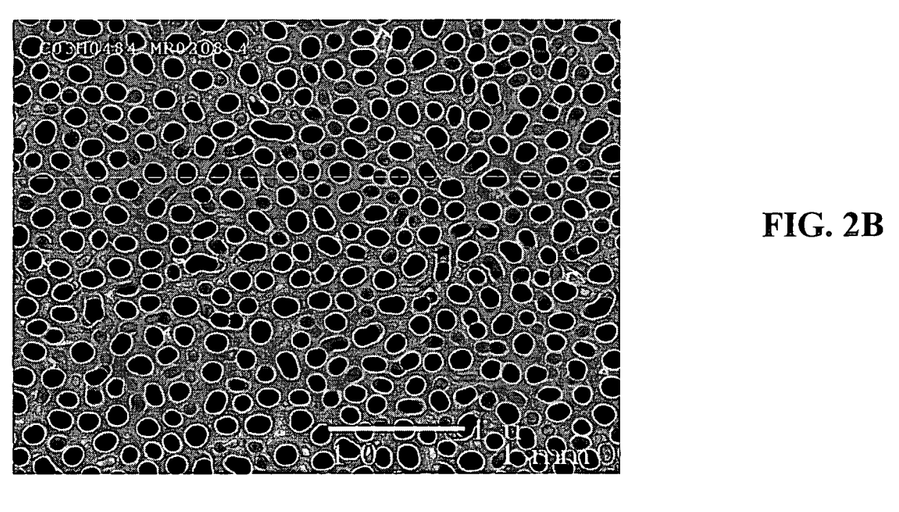
FIG. 2B depicts scanning electron microscope (SEM) image of a horizontal cross-section of an ordered nanotube alumina template of a type that may be used with embodiments of the present invention.

There are a number of different ways to form an ordered template of nanotubes. For example, in a preferred embodiment, an ordered nanotube template can be formed by anodizing from a layer of metal (e.g., aluminum, titanium or tin). The metal layer to be used to form the template could also be formed from alloys or blends of metals, e.g. combining materials such as aluminum with zinc. The metal layer may be deposited on an underlying substrate or may be a stand-alone layer, e.g., in the form of a metal foil. When the metal layer is treated anodically in an acid electrolyte, an oxide film can be formed at the metal surface. For example, aluminum, titanium or tin can be transformed into aluminum oxide (alumina), titanium oxide (titania), or tin oxide, respectively. Nanotubes may be formed in the oxide film while the oxide film is created. The oxide film may extend either partially or completely through the thickness of the metal layer. If material at the bottom of the template contains a metal oxide barrier layer, the oxide material at the bottom of the template nanotubes can be removed by chemical means or by incrementally stepping down the voltage. Simultaneously, the nanotube width can be widened by chemically etching the tube walls to reduce their average width, thus increasing the volume present in the interior of a nanotube. The anodizing voltage controls nanotube size and nanotube density, and the total amount of charge-transferred determines film thickness. Examples of nanostructured alumina templates made in this way are depicted in the SEM images of FIG. 2A and FIG. 2B. The SEM images of FIGS. 2A and 2B also illustrate an example of template nanotubes distributed in a substantially uniform fashion.

By way of example, aluminum can be treated anodically in a phosphoric acid electrolyte to form an ordered template comprised of alumina nanotubes. Al metal (e.g., 99.99% pure) may be coated onto a glass or metal foil substrate by use of evaporation, e-beam evaporation, sputtering, or the like. Alternatively, an Al foil may be commercially purchased from any of a variety of vendors. The aluminum foil or film may be anodized by treatment at an anodizing potential ranging from about 1 V to about 250 V for a specified time, e.g., on the order of several minutes, in 5–10% $H_3PO_4$, at a reaction temperature below 10° C. For example, an aluminum oxide film of roughly 30 microns thick may be generated in about 75 minutes. The preceding protocol may result in an ordered alumina template containing nanotubes with diameters ranging from about 10 nm to about 450 nm. Once the anodization is complete, to further widen the nanotubes, anodized specimens may be immersed in a 5% (vol) phosphoric acid solution at 30° C. for 5–60 min, both to enlarge the nanotube size and to remove the barrier layer typically found at the base of most nanotubes formed in a template comprised of anodic alumina. Nanotube widening and barrier layer removal may be carried out simultaneously using the same process.

It is also possible to make the ordered nanotube template by anodizing a metal layer to form an oxide film on glass, ITO-coated glass, F:$SnO_2$ coated glass, ITO coated PET or other plastic, or other coated or non-coated metal foils as well as metallized plastics. More specifically, the substrate may be a sheet of glass or plastic or metal or a continuous foil of metal or plastic with a base electrode. The base electrode (transparent or otherwise) may be the substrate. The substrate/base-electrode may be covered with a metal (e.g., aluminum) layer composed of the to-be-anodized aluminum.

Nanostructured templates, may also be made by a reactive ion etching technique using a patterned resist or an anodized ordered nanotube template as an etch mask. Such techniques are described e.g., in U.S. patent application Ser. No. 10/719,042, filed Nov. 21, 2003, which is incorporated herein by reference. Nanostructured templates can also be made by surfactant templation techniques such as those described in commonly assigned U.S. patent application Ser. Nos. 10/290,119, 10/303,665 and 10/319,406, which are incorporated herein by reference. Further, nanostructured templates can also be made by mechanical patterning/ stamping techniques such as those described in commonly assigned U.S. patent application Ser. No. 10/781,081.

The insulating nanotube template may be treated with a surface treatment that minimizes surface recombination of charge carriers. Examples of suitable surface treatments include treatments that passivate surface defects. Passivation of surface defects can be carried out using any of a variety of passivation agents, including but not limited to exposure to organic acids such as benzoic or carboxylic acid, ter-butyl-pyridine (tBP), silanes (e.g. 3-methacryloxypropyl trimethoxysilane), Methacrylic acid, polymethyl merthacrylate, detergents such as Tween 80, the application of thin coatings of aluminum oxide or titanium oxide, or heat treatment.

Other suitable surface treatments include treatment with lithium salts such as $Li[(CF_3SO_2)_2N$ and $LiClO_4$, which may reduce charge recombination and trap states, improve charge injection, and/or form a space charge layer that may screen electric fields induced by photocurrents. In particular, the surfaces of the crystalline grains may be pretreated with $Li(CF_3SO_2)_2N$ either alone or with tBP. In addition, the crystalline grains may be treated with by exposure to oxygen, UV-ozone, or oxygen plasma, or baking in an oxygen atmosphere.

According to a preferred embodiment of the present invention, the crystalline grains may be formed by atomic layer deposition (ALD), also known as atomic layer epitaxy (ALE) or atomic layer chemical vapor deposition (ALCVD). ALD is typically a self-limiting, surface-controlled, chemical vapor deposition technique that is based on the sequential, self-limiting adsorption of gaseous precursors. Discrete pulses of gaseous precursors are applied in sequentially, separated by purging pulses of non-reactive gases such as argon or nitrogen, which serve to remove excess chemical species and by-products from the reaction chamber. Upon application of a pulse of first precursor gas, the entire surface with the ALD chamber becomes saturated with a chemisorbed precursor. Following a purge of non-reactive gas, the separate and pulsed application of a second precursor gas ensures that no gas-phase reactions take place in the gas-phase. Rather, chemical reactivity is constrained to all the surfaces exposed within the ALD reaction chamber.

ALD thus permits the layer-by-layer, stepwise deposition of partial atomic monolayers during each application cycle, with the aggregate growth rate directly proportional to the number of reaction cycles rather than the pressure or concentration of precursor gases in the chamber. As a result, ALD provides a means for the uniform deposition of large surface areas within the ALD chamber with substantial control over film thickness, film uniformity, and high conformality, even for substrates with features exhibiting very high aspect ratios (e.g. 100:1). Importantly, while the ALD process is typically carried out at a deposition rate of less than 1 nm per deposition cycle, and is thus a relatively slow process compared to other CVD deposition techniques, the ALD process can nevertheless be scaled to ultra-high surface areas within a reaction chamber by using suitably wound and coiled substrates, using techniques such as those described in commonly assigned U.S. patent application Ser. No. 10/782,545. As ALD provides for a uniform and conformal coating even over high surface areas, the use of ALD eliminates the inconstant evaporation rates commonly experienced during co-evaporation, sputtering, or CVD processing of metals and metal organic precursors.

In another embodiment of the present invention, solution-based deposition can be carried out using a solution-based ink containing a precursor or precursor(s) of the active layer material. By way of example the precursor or precursor(s) may be in the form of nanoparticles (e.g., elemental metal nanoparticles, nanoparticles comprised of binary or trinary alloys, non-oxide quantum nanoparticles, or metallic nanoparticles) of about 0.1-nm to about 500-nm diameter containing elements from groups IB, IIIA and VIA. Nanoparticles may be formed using any of a variety of synthesis methods including but not limited to electro-explosion of a metal wire, nanodroplet formation by a molten material placed in a wax or other solvent, metal salt reduction, solution-based mixing of organometallic precursors such as those used in the ALD process described above, metal evaporation, electrodeposition, electropulsing, emulsion-based synthesis, sputtering, metal gas atomization, laser ablation, laser irradiation, UV-photoactivation, vapor condensation, and inert gas evaporation. Upon collection, nanoparticles may be further by milling or otherwise mechanically processed to further reduce particle size then subjected to size-dependent purification methods such as ultrafiltration or centrifugation to select nanoparticles within a particular size regime, After synthesis and (optionally) purification, nanoparticles are typically exposed to a dispersant such as a surfactant, which limits or prevents undesirable aggregation of the nanoparticles prior to their deposition on a substrate, by mixing the nanoparticles and dispersant in an aqueous or organic-solvent based mixture. A film of the ink may then be spread onto a substrate containing an ordered nanotube template, and then annealed to form crystalline grains of IB-IIIA-VIA material. The nanoparticles may have a narrow size distribution characterized by an average nanoparticle size D. For example, the nanoparticles used to make up the film may have sizes within about 40% of D. If the average particle size is less than about 5 nm, then the variation can be bigger, e.g., between about 1 nm and about 2 nm. By way of example, the particles in the liquid may include Cu with In or Ga and Se or S in a stoichiometric ratio of approximately $CuIn_{1-x}Ga_x(S, Se)_2$, where x is between 0 and 1. The size distribution of the nanoparticles is typically chosen to be less than the average width, depth, and aspect ratio of the nanotubes in the template, which promotes the deposition and filling of the nanotubes with the nanoparticles.

It should also be understood that group IB, IIIA, and VIA elements other than Cu, In, Ga, Se, and S may be included in the description of the IB-IIIA-VIA alloys described herein, and that the use of a hyphen ("—" e.g., in Cu—Se or Cu—In—Se) does not indicate a compound, but rather indicates a coexisting mixture of the elements joined by the hyphen. Where several elements can be combined with or substituted for each other, such as In and Ga, or Se, and S, in embodiments of the present invention, it is not uncommon in this art to include in a set of parentheses those elements that can be combined or interchanged, such as (In, Ga) or (Se, S). The descriptions in this specification sometimes use this convenience. Finally, also for convenience, the elements are discussed with their commonly accepted chemical symbols. Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) or indium (In). Group VIA elements of interest include selenium (Se), sulfur (S), and tellurium (Te), and preferably the group VIA element is either Se or S.

A non-oxide CIGS ink has great utility for low cost web coating of ink-based photovoltaic cells. Significantly, this approach may be implemented without selenization of the particles, film or IB-IIIA-VIA layer using $H_2Se$. In addition, the use of non-oxide or elemental metal particles avoids having to reduce the particles, film or IB-IIIA-VIA layer with $H_2$. Examples of such inks are described in commonly assigned U.S. patent application Ser. No. 10/782,017 entitled "SOLUTION-BASED FABRICATION OF PHOTOVOLTAIC CELL."

In yet another embodiment of the present invention, solution-based deposition can be carried out using electrodeposition. Electrodeposition is defined as the deposition of a conductive material from a plating solution by the application of electrical current. To electrodeposit a CIGS film into the nanotemplate, an electrodeposition bath is prepared which contains ions of copper, indium, gallium, and selenium. More specifically, an electrodeposition bath can be made which contains 0.1–0.3 M copper ions obtained from e.g. copper chloride, 0.05–0.3M indium ions obtained from e.g. indium chloride, 0.05–0.3M gallium ions obtained from e.g. gallium chloride, and 0.01–0.05M selenium ions, which allows for the co-electrodeposition of copper, indium, gallium, and selenium. An electrodeposition potential is applied with a high frequency alternating current superimposed upon a DC current. The electrodeposition bath can be based either on an aqueous solvent or an non-aqueous, organic solvent such as DMSO. Additional reagents can be added to the bath such as lithium or other materials to improve the deposition process.

Any of the deposition techniques described above can be combined. For example, a template of nanotubes can be partially filled by electrodeposition or solution-based ink deposition of a filler material and the remaining pore volume filled by ALD. In addition, alternative techniques to deposit materials into nanotubes include but are not limited to electroless plating, chemical bath deposition, liquid phase deposition (LPD), layer-by-layer assembly, and the like. Further, vacuum-based deposition techniques such as sputtering, evaporation, chemical vapor deposition, and physical vapor deposition can be used to deposit material into the nanotubes.

A further advantage of deposition of mixtures of materials into a template of nanotubes is that the initial mixed deposit is constrained within the tubes, limiting the potential for the mixtures to separate out into their constituent components and/or phases beyond the spatial scale of a nanotube (rather than the macroscopic surface of the substrate), and also reducing the potential for pooling of the deposited material even if the macroscopic surface is uneven or warped.

Figure 3:
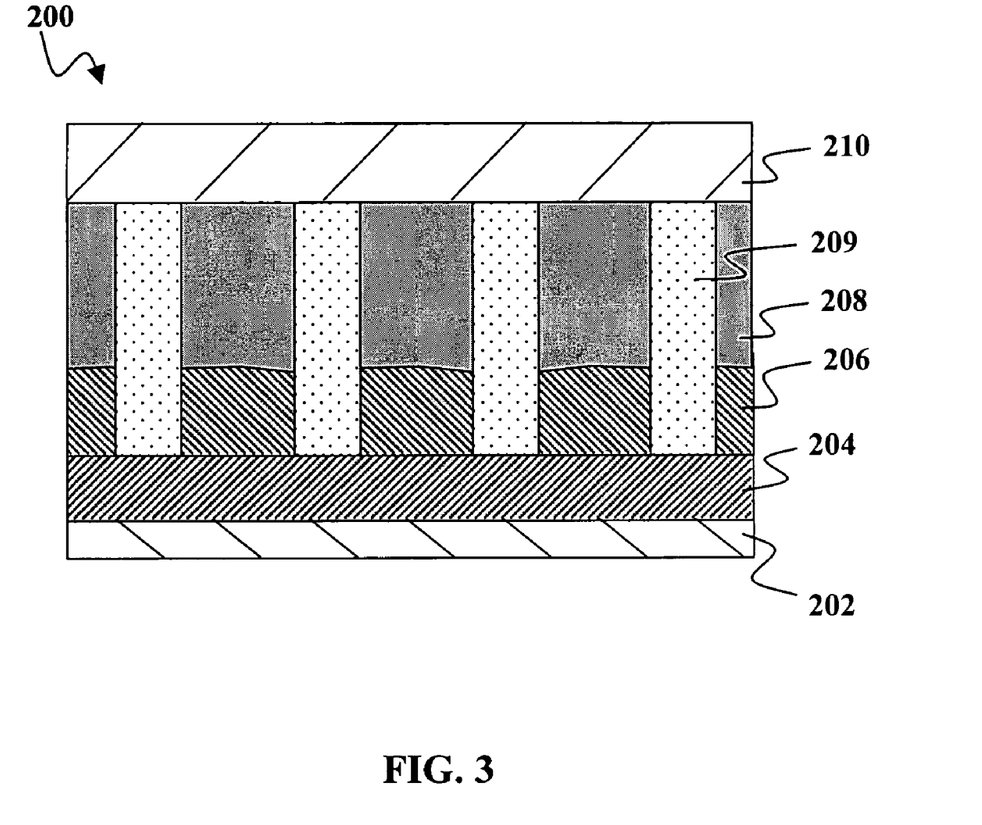
FIG. 3 is a schematic diagram of an optoelectronic device according to an embodiment of the present invention.

Embodiments of the present invention may be implemented in the active layer of an optoelectronic device, e.g., a photovoltaic cell 200 of the type shown in FIG. 3. The cell 200 generally includes a substrate or base layer 202, a base electrode 204, an active layer material 208, an optional window layer material 206, a nanotube template 209 and a transparent electrode 210. The base layer 202 may be made from a thin flexible material suitable for roll-to-roll processing. By way of example, the base layer may be made of a metal foil, such as titanium, tin, or aluminum, or an alloy of different metals, a polymer such as polyimide, or a metallized plastic. The base electrode 204 is made of an electrically conducive material. By way of example, the base electrode 204 may be a layer of aluminum, e.g., about 0.5 micron to about 1 micron thick.

The active layer material 208 is in the form of crystalline grains, occupying the nanotubes in the ordered nanotube template 209. A majority of the crystalline grains of the active layer material 208 are separated from neighboring grains by a wall of the template 209. By way of example, and without limitation, the active layer 208 may include crystalline grains containing elements of groups IB-IIIA-VIA. The active layer material 208 general may be of the general formula $CuIn_{1-x}Ga_x(S \text{ or } Se)_2$. Alternatively, the active layer material 208 may contain cadmium (Cd) and an element from group VIA, e.g., CdTe or CdSe, and the like. Furthermore, the active layer material 208 may include grains of microcrystalline silicon (μc-Si). Several techniques be used to deposit microcrystalline silicon, including VHF-PECVD, Hot Wire CVD, and Pulsed PECVD.

As described above, the active layer material 208 may be fabricated by depositing a film of a nanoparticle-based ink, paste or slurry, into the nanotubes of the ordered nanotube template 209. The ink may be annealed by heating to a temperature sufficient to burn off any binders or cap layers on the particles in the ink and sinter the particles together to form grains. After annealing, the film may optionally be exposed to selenium vapor at about 300–500° C. for about 30–45 minutes to ensure the proper stoichiometry of Se in the film. Alternatively, the film may optionally be exposed to hydrogen selenide to ensure proper stoichiometry of Se in the film. To carry out such a Se vapor exposure, the film, if deposited on a flexible substrate, can be wound into a coil and the coil can be coated so that the entire roll is exposed at the same time, substantially increasing the scaleability of the Se vapor exposure process through such a high-volume batch process, e.g., as described in commonly assigned U.S. patent application Ser. No. 10/782,545 entitled "HIGH THROUGHPUT SURFACE TREATMENT ON COILED FLEXIBLE SUBSTRATES", the disclosures of which are incorporated herein by reference.

In the example depicted in FIG. 3, the window layer material 206 is between the bottom electrode 204 and the active layer material 208. Alternatively, the window layer 206 can be between the active layer 208 and the top electrode 210. The window layer material 206 may also be in the form of crystalline grains occupying the nanotubes in the ordered nanotube template 209. A majority of the crystalline grains of the window layer material 206 are separated from neighboring grains by a wall of the template 209. By way of example, the window layer may include cadmium sulfide (CdS), zinc sulfide (ZnS), or zinc selenide (ZnSe) or some combination of two or more of these materials. Such materials may be deposited, e.g., by chemical bath deposition. Alternatively, such materials may be deposited by electrodeposition, ALD, or the like. The thickness of the window layer is typically on the order of about 50 to 100 nm.

The ordered nanotube template 209 contains nanotubes that are sufficiently small such that the majority of the nanotubes contain only a single grain of the active layer material 208 and/or a single grain of the window layer material 206. It is often desirable that the template 209 be made from a material that is transparent to radiation, e.g., in the visible and near IR frequency ranges. The material of the template 209 provides nanotube walls that physically and electrically isolate neighboring grains from each other. The isolation beneficially reduces the effects of grain boundaries compared to polycrystalline active layer formed on a flat substrate by reducing the number of electronically active interfaces at the grain boundaries between adjacent grains. The isolation further promotes adhesion of the inorganic material within the nanotubes of the template, providing for increased mechanical stability and durability. The template 209 may also scatter incident radiation to enhance harvesting of the radiation by the active layer material 208.

In a preferred embodiment, the ordered nanotube template is made of an insulating material such as alumina (aluminum oxide) or other insulating materials. The template 209 may be formed by oxidizing a layer of metal (e.g., aluminum) disposed on a surface of the base electrode 204 as described above. In some cases, the base electrode may be partially anodized, e.g., as described above, to form the template 209. Furthermore, it is possible for a single layer to act as both the substrate 202 and the base electrode 204 and the metal layer that is partially anodized to form the template 209. Alternatively, a metal layer may be deposited on the base electrode 202 and completely anodized so that the ordered nanotube template 209 extends all the way to the base electrode 204. Preferably, the template 209 contains nanotubes, which may be distributed in a substantially uniform fashion, although exact uniform spacing, shape or size is not strictly required. The nanotubes can be elongated structures, including, but not limited to, nanotubes, channels, pillars, and the like, that may be substantially cylindrical in shape. Alternatively, the nanotubes may have a cone-like shape, e.g., truncated cones tapering with the wider end furthest from the bottom electrode 204. The cone-like shape may also be reversed, i.e., with the wider openings being at the bottom and the narrower openings at the top. In some embodiments, the template nanotubes may be in the form of, e.g., hollow nanotubes with spaces between the sidewalls of the nanotubes or substantially straight and parallel channels formed through an otherwise solid material with walls of the material between adjacent channels.

The transparent electrode 210 may include a transparent conductive oxide, e.g., zinc oxide (ZnO) or aluminum doped zinc oxide (ZnO:Al), which can be deposited using any of a variety of means including but not limited to sputtering, evaporation, CBD, electroplating, CVD, PVD, ALD, and the like. If the substrate is flexible and the deposition technique is ALD or CBD or the like, a coiled/wound flexible substrate can be exposed so that the entire roll is processed at one time, e.g., as described above. The transparent electrode 210 may further include a layer of metal (e.g., Ni, Al or Ag) fingers to reduce the overall sheet resistance.

In certain embodiments of the invention, the template may be removed, leaving behind crystalline grains of active layer material. By way of example a ordered nanotube alumina template may be removed by immersion in 6M NaOH, followed by extensive rinsing to remove any residual base or debris material. The grains have a uniformity of size and shape comparable to the uniformity of size and shape of the nanotubes. In certain embodiments, the grains may then be mixed with a liquid to form an ink having grains of a uniform size.

Embodiments of the present invention provide for reduced grain boundary effects and greater uniformity of grain sizes. The nanotube insulating template can also have advantages in terms of limiting the lateral diffusion of materials during the production of the cells. For instance, many thin-film solar cells include annealing steps at a temperature that effectively leads to the melting and recrystallization of materials in the active layer. With the template nanotubes, any negative lateral diffusion of materials is constrained and the grain size can be controlled.

In addition, the deposition of CIGS material into the nanotubes also provides for excellent adhesion of the deposited material within the nanotubes. By depositing into nanotubes embedded in the substrate itself, it may be possible to minimize the Mo deposition layer or to avoid it altogether.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. The appended claims are not to be interpreted as including means-plus-function limitations, unless such a limitation is explicitly recited in a given claim using the phrase "means for."

What is claimed is:

1. A method for passivating grain boundaries in an inorganic active layer of an optoelectronic device, comprising the steps of:

preparing a three-dimensional insulating nanotube template having a plurality of nanotubes; and forming crystalline grains of an active layer material within the nanotubes using a deposition technique, wherein the dimensions of the nanotubes correspond to the dimensions of a crystalline grain formed by the deposition technique, whereby a majority of the nanotubes each contain a single crystalline grain of the active layer material; and wherein a majority of the surface area of the crystalline grains is in contact with a wall of the nanotube template rather than with other grains.

2. The method of claim 1, further comprising treating the insulating template with a surface treatment that minimizes surface recombination of charge carriers.

3. The method of claim 2, wherein the surface treatment is selected from the group of exposure to organic acids, exposure to detergents, application of thin coatings of metal oxides, heat treatment or oxygen treatment.

4. The method of claim 1 wherein a diameter of the nanotubes is of the order of an average size of the crystalline grains.

5. The method of claim 1 wherein the step of forming crystalline grains includes depositing an ink containing a precursor of the active layer material and annealing the precursor to form the crystalline grains.

6. The method of claim 1 wherein the step of forming crystalline grains includes depositing one or more materials in the nanotubes by atomic layer deposition.

7. The method of claim 1 wherein the step of forming crystalline grains includes depositing one or more materials in the nanotubes by electrodeposition.

8. The method of claim 1 wherein the active layer material includes elements from groups IB, IIIA and VIA or contains cadmium (Cd) and an element from group VIA.

9. The method of claim 1 wherein the active layer material includes microcrystalline silicon.

10. The method of claim 1, further comprising the step of removing the ordered nanotube template leaving behind crystalline grains.

11. The method of claim 10, further comprising mixing the grains to form a liquid ink.

12. The method of claim 11 wherein the ink includes elements from groups IB, IIIA and VIA or contains cadmium (Cd) and an element from group VIA.

13. The method of claim 1 wherein preparing a nanotube template includes anodizing a layer of metal.

14. The method of claim 13 wherein the layer of metal is a layer of aluminum.

15. The method of claim 1 wherein preparing a nanotube template includes forming the nanotube template by a technique chosen from the group of reactive ion etching using a patterned resist or an anodized ordered nanotube template as an etch mask, surfactant templation techniques and mechanical patterning or stamping techniques.

16. The method of claim 1, further comprising determining a distribution of expected grain sizes for the crystalline grains.

17. The method of claim 16 wherein preparing the ordered nanotube template includes making the nanotubes sufficiently small that the nanotubes are smaller than a majority of the expected grain sizes.

18. The method of claim 1 wherein preparing a nanotube template includes surfactant templation.

19. The method of claim 1, further comprising treating the insulating nanotube template with a surface treatment that minimizes surface recombination of charge carriers.

20. A method for passivating grain boundaries in an inorganic active layer of a photovoltaic device, comprising the steps of:

preparing a three-dimensional insulating nanotube template having a plurality of nanotubes;

forming crystalline grains of an active layer material within the nanotubes using a deposition technique, wherein the dimensions of the nanotubes correspond to the dimensions of a crystalline grain formed by the deposition technique, whereby a majority of the nanotubes each contain a single crystalline grain of the active layer material; and wherein a majority of the surface area of the crystalline grains is in contact with a wall of the nanotube template rather than with other grains; and forming the photovoltaic device with the active layer comprised of the active layer material.

21. The method of claim 20 wherein the photovoltaic device comprises the active layer and a substrate comprised of a metal foil.

22. The method of claim 20 wherein the photovoltaic device comprises the active layer and a substrate comprised of aluminum.

23. The method of claim 20 wherein the photovoltaic device comprises the active layer and a substrate comprised of one or more of the following selected from the group consisting of: titanium, tin, aluminum, a metal alloy, a polymer, polyimide, or a metallized plastic.

24. A method for passivating grain boundaries in an active layer of a photovoltaic device, comprising the steps of:

preparing a three-dimensional insulating nanotube template having a plurality of nanotubes; and forming crystalline grains of an active layer material within the nanotubes using a deposition technique, wherein the dimensions of the nanotubes correspond to the dimensions of a crystalline grain formed by the deposition technique, whereby a majority of the nanotubes each contain a single crystalline grain of the active layer material; and wherein a majority of the surface area of the crystalline grains is in contact with a wall of the nanotube template rather than with other grains;

wherein the active layer material comprises $CuIn_{1-x}Ga_x(S$ or $Se)_2$, wherein x is between 0 and 1.

* * * * *